US012412761B2

United States Patent
Onishi et al.

(10) Patent No.: US 12,412,761 B2
(45) Date of Patent: Sep. 9, 2025

(54) METHOD OF CONTROLLING THE PATTERNED WAFER PROCESS TEMPERATURE USING THE CONTACT TYPE THERMOMETER IN THE FRONT SIDE OF A DUMMY SUBSTRATE TO ACCURATELY MEASURE EMISSIVITY IN ORDER TO PERFORM TEMPERATURE MEASUREMENT USING RADIATION THERMOMETER

(71) Applicant: SCREEN Holdings Co., Ltd., Kyoto (JP)

(72) Inventors: Shuhei Onishi, Kyoto (JP); Takahiro Kitazawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 808 days.

(21) Appl. No.: 17/577,432

(22) Filed: Jan. 18, 2022

(65) Prior Publication Data

US 2022/0277972 A1    Sep. 1, 2022

(30) Foreign Application Priority Data

Feb. 26, 2021   (JP) ................. 2021-030353

(51) Int. Cl.
*H01L 21/67*   (2006.01)
*G01K 7/02*    (2021.01)

(52) U.S. Cl.
CPC ........ *H01L 21/67248* (2013.01); *G01K 7/028* (2013.01); *H01L 21/67115* (2013.01)

(58) Field of Classification Search
CPC .......... G01J 5/0007; G01J 5/061; G01J 5/802; G01J 2005/0074; G01J 2005/063;
(Continued)

(56) References Cited

U.S. PATENT DOCUMENTS

| | | | | |
|---|---|---|---|---|
| 4,924,073 A | * | 5/1990 | Chiba | ................ C30B 31/12 219/494 |
| 6,200,023 B1 | | 3/2001 | Tay et al. | |

(Continued)

FOREIGN PATENT DOCUMENTS

| | | |
|---|---|---|
| CN | 105624638 A | 6/2016 |
| JP | S62-110127 A | 5/1987 |

(Continued)

OTHER PUBLICATIONS

Request for the Submission of an Opinion dated Feb. 14, 2024 in corresponding Korean Patent Application No. 10-2022-0020653 and a computer generated English translation obtained from the JPO.

(Continued)

*Primary Examiner* — Ermias T Woldegeorgis
(74) *Attorney, Agent, or Firm* — OSTROLENK FABER LLP

(57) ABSTRACT

While a wafer having a front surface to which a thermocouple is attached is heated, a temperature of the front surface of the wafer is measured with the thermocouple and a temperature of a back surface thereof is measured with a back surface side radiation thermometer. Emissivity set to the back surface side radiation thermometer is corrected based on the temperature of the wafer measured with the thermocouple. Next, while the semiconductor wafer with a pattern on the front surface is heated, the temperature of the back surface and the temperature of the front surface of the semiconductor wafer are measured with the back surface side radiation thermometer and the front surface side radiation thermometer, respectively. Emissivity set to the front surface side radiation thermometer is corrected based on the temperature of the semiconductor wafer measured with the back surface side radiation thermometer.

8 Claims, 9 Drawing Sheets

(58) Field of Classification Search
CPC . G01K 1/14; G01K 7/02; G01K 7/028; H01L 21/67115; H01L 21/67248; H01L 22/12; H01L 22/20

See application file for complete search history.

(56) References Cited

U.S. PATENT DOCUMENTS

| | | |
|---|---|---|
| 6,283,630 B1 | 9/2001 | Yazawa |
| 2016/0148803 A1* | 5/2016 | Wu .................. H01L 21/67248 118/712 |
| 2017/0178979 A1* | 6/2017 | Furukawa ............ H05B 1/0233 |
| 2020/0080894 A1 | 3/2020 | Leow et al. |

FOREIGN PATENT DOCUMENTS

| | | |
|---|---|---|
| JP | H01-204114 A | 8/1989 |
| JP | H04-2930 A | 1/1992 |
| JP | H04-69531 A | 3/1992 |
| JP | 5-299428 A | 11/1993 |
| JP | H05295543 A * | 11/1993 |
| JP | H10-48052 A | 2/1998 |
| JP | 2000-121447 A | 4/2000 |
| JP | 2001-208610 A | 8/2001 |
| JP | 2001-274109 A | 10/2001 |
| JP | 2014-185898 A | 10/2014 |
| JP | 2019-168307 A | 10/2019 |
| JP | 2020-004897 A | 1/2020 |
| KR | 1992-008783 B1 | 10/1992 |
| KR | 10-2002-0000773 A | 1/2002 |
| TW | 201839382 A | 11/2018 |
| WO | WO 00/55587 A1 | 9/2000 |

OTHER PUBLICATIONS

Notice of Reasons for Refusal dated Jan. 7, 2025 in corresponding Japanese Patent Application No. 2021-030353 and a computer generated English translation obtained from the JPO.

Notification of Granting Patent Right of Invention with Search Report dated Jul. 1, 2025 in corresponding Chinese Patent Application No. 202210137033.5.

* cited by examiner

METHOD OF CONTROLLING THE PATTERNED WAFER PROCESS TEMPERATURE USING THE CONTACT TYPE THERMOMETER IN THE FRONT SIDE OF A DUMMY SUBSTRATE TO ACCURATELY MEASURE EMISSIVITY IN ORDER TO PERFORM TEMPERATURE MEASUREMENT USING RADIATION THERMOMETER

BACKGROUND OF THE INVENTION

Field of the Invention

The present invention relates to a temperature measurement method that measures a temperature of a thin plate-like precision electronic substrate (hereinafter referred to simply as a "substrate") such as a semiconductor wafer in a non-contact manner.

Description of the Background Art

A flash lamp anneal (FLA) which heats a semiconductor wafer for an extremely short time in a process of manufacturing a semiconductor device attracts attention. The flash lamp anneal is a heat treatment technique of irradiating a surface of a semiconductor wafer with a flash of light using a xenon flash lamp (a simple term of "a flash lamp" means a xenon flash lamp hereinafter), thereby increasing a temperature of only the surface of the semiconductor wafer in an extremely short time (several milliseconds or less).

A radiation spectral distribution of the xenon flash lamp ranges from an ultraviolet region to a near-infrared region, thus a wavelength of the xenon flash lamp is shorter than that of a conventional halogen lamp, and almost coincides with a basic absorption band of a silicon semiconductor wafer. Thus, when the semiconductor wafer is irradiated with a flash of light emitted from the xenon flash lamp, the temperature of the semiconductor wafer can be rapidly increased with less transmitted light. It is also known that a flash light emission for the extremely short time of several milliseconds or less can selectively increase a temperature of only a region near the surface of the semiconductor wafer.

Such a flash lamp anneal is used for processing requiring a heating for an extremely short time, for example, typically an activation of impurity implanted into the semiconductor wafer. When the surface of the semiconductor wafer into which the impurity is implanted by an ion implantation method is irradiated with a flash of light from the flash lamp, the surface of the semiconductor wafer can be increased to an activation temperature only for the extremely short time, thus only an impurity activation can be executed without deeply diffusing the impurity.

It is important to manage a wafer temperature in not only the flash lamp anneal but also a heat treatment of the semiconductor wafer. The temperature of the semiconductor wafer during the heat treatment is typically measured by a radiation thermometer in a non-contact manner. Emissivity of an object to be measured needs to be accurately set to a radiation thermometer to perform a temperature measurement with high accuracy using the radiation thermometer. Accordingly, emissivity of a surface of a semiconductor wafer needs to be set to a radiation thermometer to accurately measure a surface temperature of the semiconductor wafer rapidly changing at a time of a flash light irradiation using the radiation thermometer.

However, some pattern is formed on a front surface of a semiconductor wafer irradiated with a flash of light in many cases. The emissivity of the front surface of the semiconductor wafer depends on a pattern. That is to say, when a pattern formed on a front surface of a semiconductor wafer is different, emissivity of the front surface is also different. Thus, there is a necessity of obtaining emissivity of a front surface for each semiconductor wafer subject to the heat treatment to set the emissivity to a radiation thermometer.

Japanese Patent Application Laid-Open No. 2014-185898 discloses a technique of accurately measuring a temperature of a back surface, whose emissivity is already known, of a semiconductor wafer and calculating emissivity of a front surface of the semiconductor wafer based on the temperature of the back surface to measure a temperature of the front surface. Japanese Patent Application Laid-Open No. 5-299428 discloses a technique of placing a monitor wafer whose emissivity is already known close to a semiconductor wafer to be measured and obtaining emissivity of the semiconductor wafer based on a temperature measurement value of the monitor wafer to measure a temperature of the semiconductor wafer.

However, the technique disclosed in Japanese Patent Application Laid-Open No. 2014-185898 cannot be applied unless the emissivity of the back surface of the semiconductor wafer is already known. In the meanwhile, in the technique disclosed in Japanese Patent Application Laid-Open No. 5-299428, the monitor wafer whose emissivity is already known needs to be prepared additionally. In the technique disclosed in Japanese Patent Application Laid-Open No. 5-299428, the monitor wafer has contact with the semiconductor wafer to be measured, thus a pattern formed on a front surface of the semiconductor wafer may be damaged.

SUMMARY OF THE INVENTION

The present invention is directed to a heat measurement method of measuring a temperature of a substrate.

According to one aspect of the present invention, a temperature measurement method includes steps of: (a) measuring a temperature of a back surface of a first substrate with a back surface side radiation thermometer while heating the first substrate having a front surface to which a contact-type thermometer is attached, and correcting emissivity set to the back surface side radiation thermometer based on a temperature of the first substrate measured with the contact-type thermometer; (b) measuring a temperature of a back surface and a temperature of a front surface of a second substrate having a pattern formed on the front surface with the back surface side radiation thermometer and a front surface side radiation thermometer, respectively, while heating the second substrate, and correcting emissivity set to the front surface side radiation thermometer based on a temperature of the second substrate measured with the back surface side radiation thermometer; and (c) measuring a temperature of the front surface of the second substrate heated by irradiation with light with the front surface side radiation thermometer.

Emissivity set to the back surface side radiation thermometer and the front surface side radiation thermometer is corrected in two stages based on an accurate temperature measurement value obtained by the contact-type thermometer. Thus even if the emissivity of both the front and back surfaces of the substrate is unknown, the front surface temperature of the substrate can be accurately measured.

It is preferable that in the step (a), the temperature of the first substrate is measured with the contact-type thermometer and the back surface side radiation thermometer when the first substrate is maintained at a predetermined temperature by irradiation with light from the continuous lighting lamps, and in the step (b), the temperature of the second substrate is measured with the back surface side radiation thermometer and the front surface side radiation thermometer when the second substrate is maintained at a predetermined temperature by irradiation with light from the continuous lighting lamps.

There is no difference in temperature in the front and back surfaces of the first substrate and the second substrate, and the emissivity set to the back surface side radiation thermometer and the front surface side radiation thermometer can be accurately corrected.

It is preferable that a position where the contact-type thermometer is attached and a position where the back surface side radiation thermometer measures a temperature are symmetric with respect to the first substrate, and a position where the back surface side radiation thermometer measures a temperature and a position where the front surface side radiation thermometer measures a temperature are symmetric with respect to the second substrate.

There is no difference in temperature in the front and back surfaces of the first substrate and the second substrate, and the emissivity set to the back surface side radiation thermometer and the front surface side radiation thermometer can be accurately corrected. It is preferable that a light receiving element of the front surface side radiation thermometer is cooled to 0° C. or less when the temperature of the front surface of the second substrate is measured.

The light receiving element of the front surface side radiation thermometer can maintain high sensitivity, and the front surface temperature of the substrate can be accurately measured.

If is preferable that a wall surface of a chamber housing the first substrate and the second substrate is cooled.

An influence of stray light entering the back surface side radiation thermometer and the front surface side radiation thermometer can be suppressed, and reduction in accuracy of the temperature measurement can be prevented.

Thus, an object of the present invention is to accurately measure the front surface temperature of the substrate even if the emissivity of the front and back surfaces of the substrate is unknown.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments according to the present invention will now be described in detail with reference to the drawings.

Figure 1:
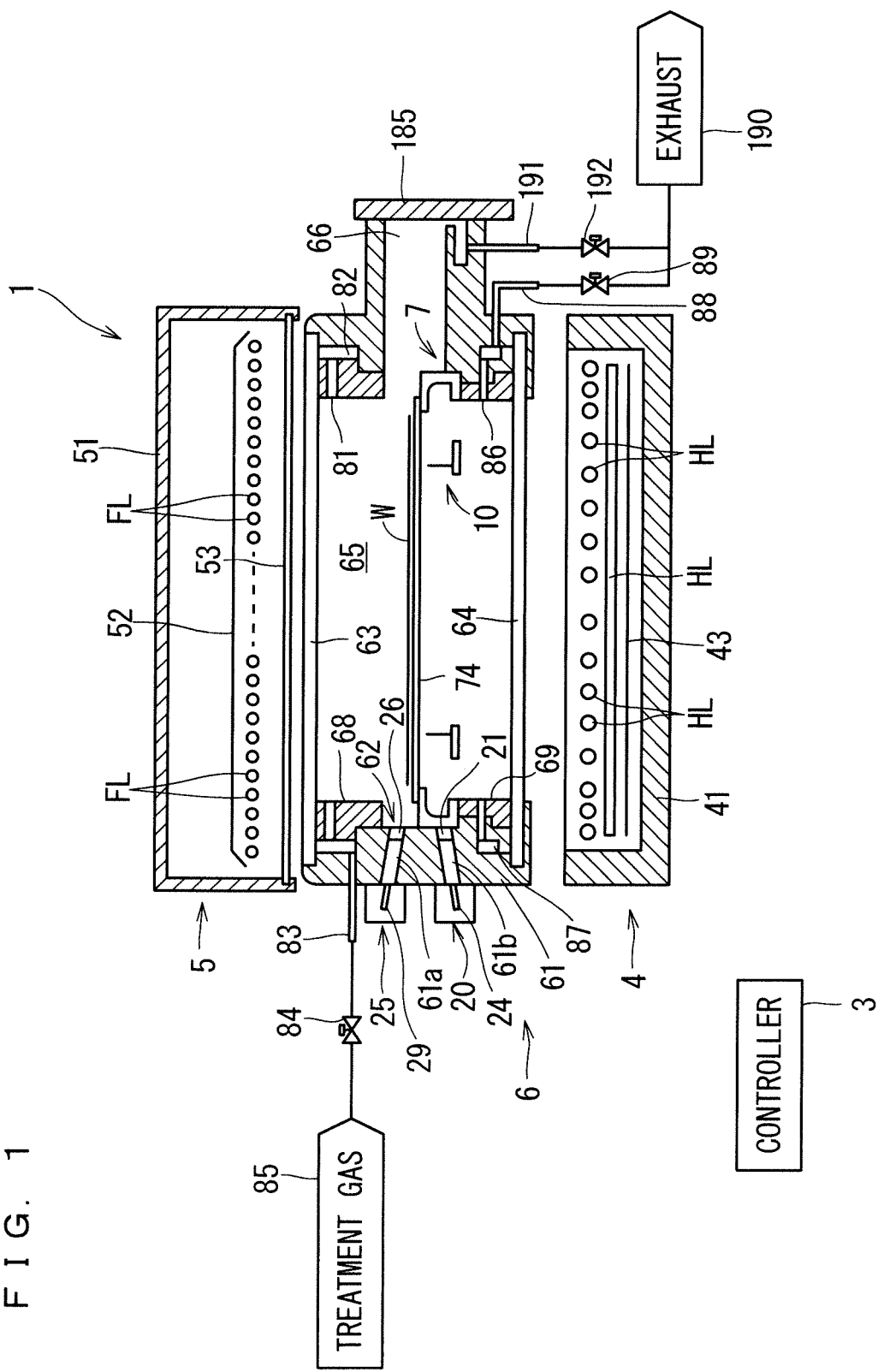
FIG. 1 is a longitudinal sectional view showing a configuration of a heat treatment apparatus performing a heat measurement method according to the present invention.

FIG. 1 is a longitudinal sectional view showing a configuration of a heat treatment apparatus 1 performing a heat measurement method according to the present invention. The heat treatment apparatus 1 in FIG. 1 is a flash lamp annealer for heating a disk-shaped semiconductor wafer W serving as a substrate by irradiating the semiconductor wafer W with a flash of light. A size of the semiconductor wafer W to be processed is not particularly limited. For example, the semiconductor wafer W to be processed has a diameter of 300 mm or 450 mm (300 mm in the present embodiment). It should be noted that dimensions of components and the number of components are illustrated in exaggeration or in simplified form, as appropriate, in FIG. 1 and the subsequent drawings for the sake of easier understanding.

The heat treatment apparatus 1 includes a chamber 6 for housing the semiconductor wafer W, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 includes a holder 7 provided inside the chamber 6 and for holding the semiconductor wafer W in a horizontal attitude, and a transfer mechanism 10 provided inside the chamber 6 and for transferring the semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to execute a heat treatment on the semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds the semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of the semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, the semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b bored therein. The through hole 61a is a cylindrical hole for directing infrared radiation emitted from an upper surface of the semiconductor wafer W held by a susceptor 74 to be described later therethrough to an infrared radiation sensor 29 of a front surface side radiation thermometer 25. In the meanwhile, the through hole 61b is a cylindrical hole for directing infrared radiation emitted from a lower surface of the semiconductor wafer W therethrough to an infrared radiation sensor 24 of a back surface side radiation thermometer 20. The through hole 61a and the through hole 61b are inclined with respect to a horizontal direction so that an axis extending in a direction in which the through holes 61a and 61b extend through the chamber side portion 61 intersects a main surface of the semiconductor wafer W held by the susceptor 74. A transparent window 26 made of calcium fluoride material transparent to infrared radiation in a wavelength range measurable with the front surface side radiation thermometer 25 is mounted to an end portion of the through hole 61a which faces the heat treatment space 65. A transparent window 21 made of barium fluoride material transparent to infrared radiation in a wavelength range measurable with the back surface side radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is supplied from the treatment gas supply source 85 to the buffer space 82. The treatment gas which has flowed into the buffer space 82 flows in a spreading manner within the buffer space 82 which is lower in fluid resistance than the gas supply opening 81, and is supplied through the gas supply opening 81 into the heat treatment space 65. An inert gas such as nitrogen ($N_2$), a reactive gas such as hydrogen ($H_2$) and ammonia ($NH_3$), or a gas mixture thereof, for example, can be used as the treatment gas (nitrogen gas in the present embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be a utility in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
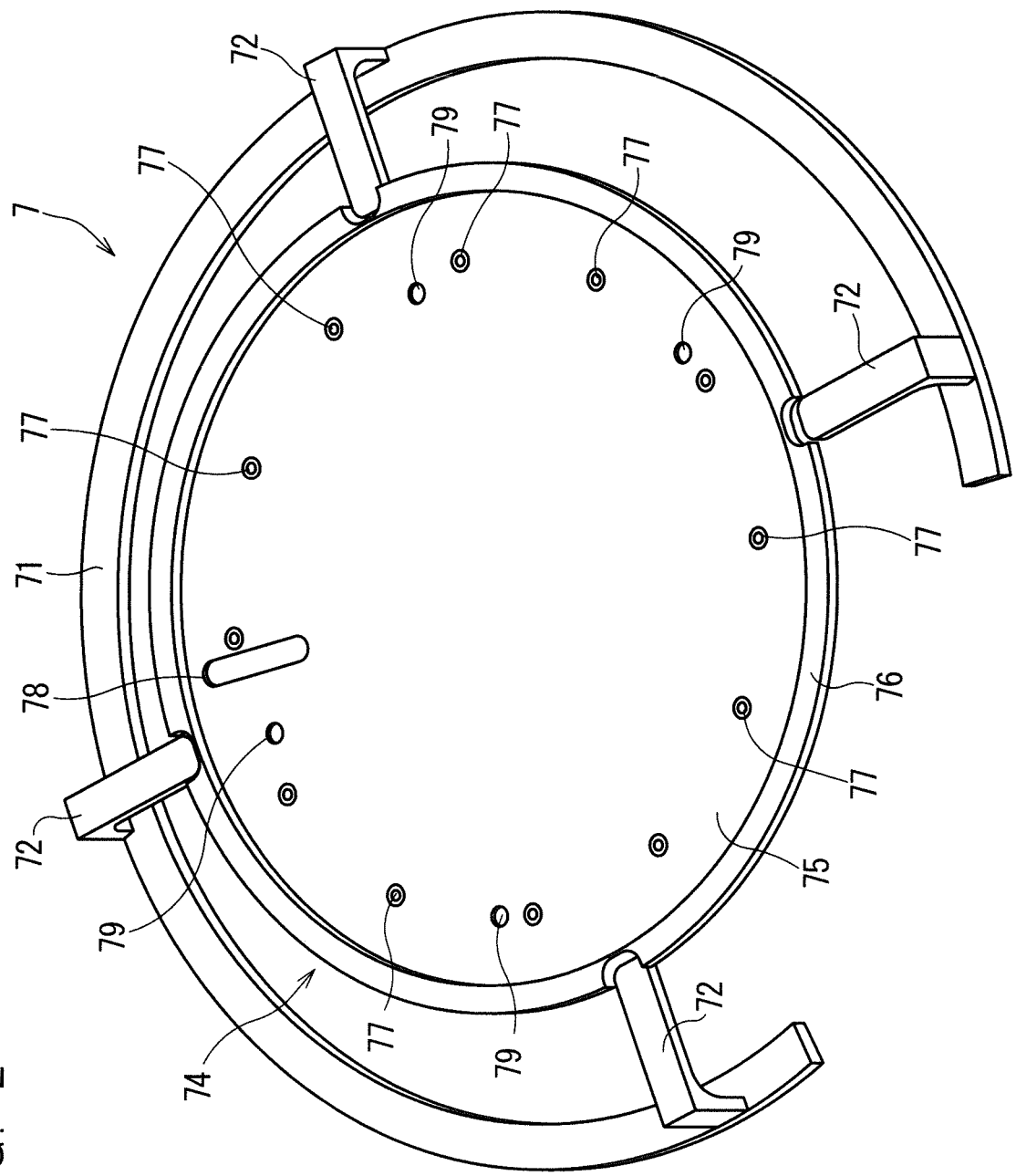
FIG. 2 is a perspective view illustrating an entire external appearance of a holder.

FIG. 2 is a perspective view illustrating an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 3:
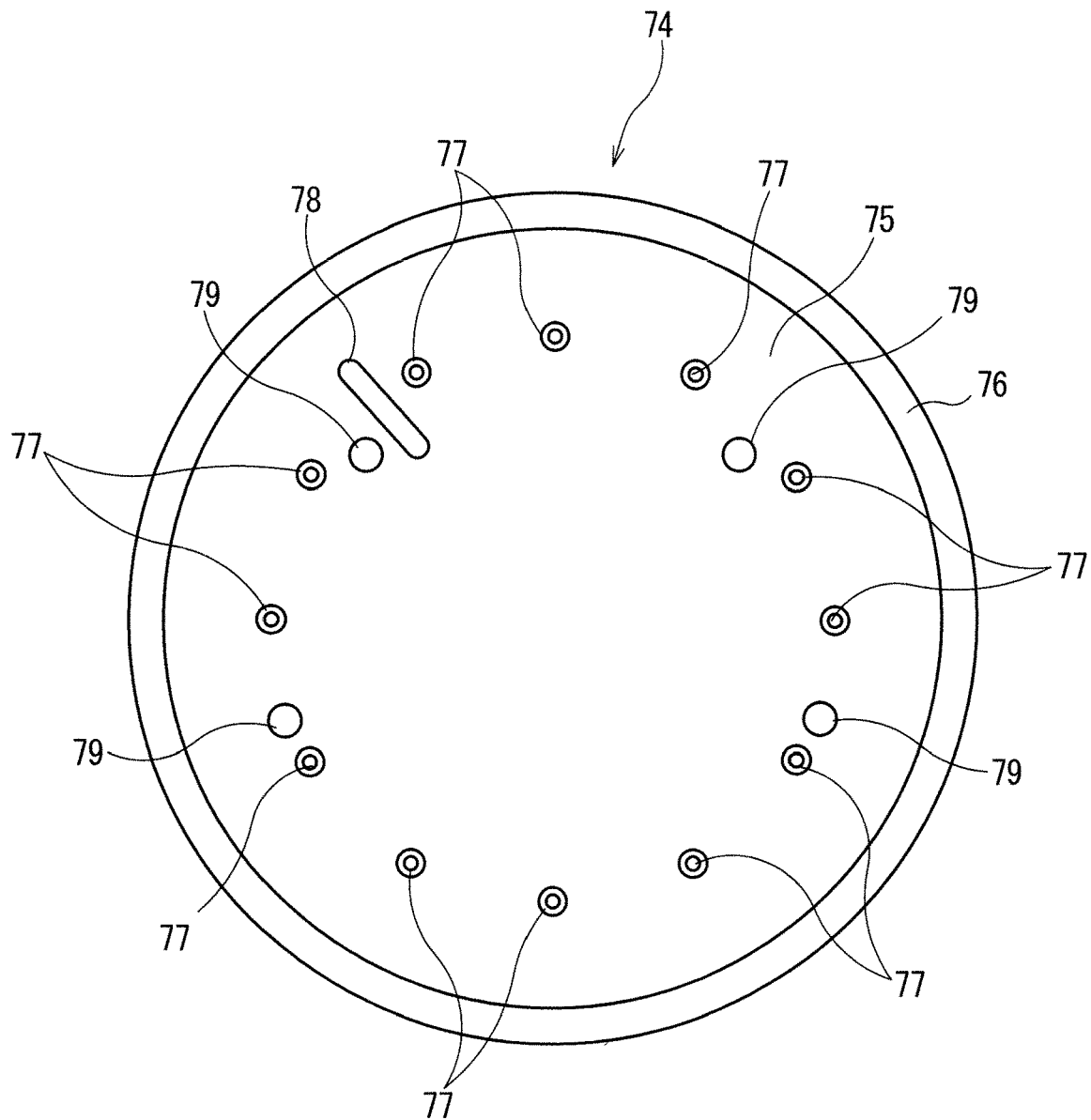
FIG. 3 is a plan view of a susceptor.
Figure 4:
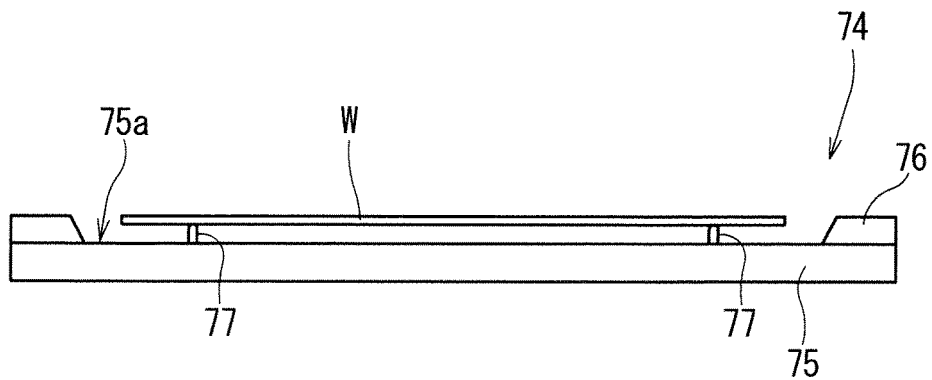
FIG. 4 is a sectional view of the susceptor.

The susceptor 74 is supported by the four coupling portions 72 provided on the base ring 71. FIG. 3 is a plan view of the susceptor 74. FIG. 4 is a cross-sectional view of the susceptor 74. The susceptor 74 includes a holding plate 75, a guide ring 76, and a plurality of substrate support pins 77. The holding plate 75 is a generally circular planar member made of quartz. A diameter of the holding plate 75 is greater than that of the semiconductor wafer W. In other words, the holding plate 75 has a size, as seen in plan view, greater than that of the semiconductor wafer W.

The guide ring 76 is provided on a peripheral part of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral part of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

The semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. A thickness of the guide ring 76 is greater than the height of the substrate support pins 77. Thus, the guide ring 76 prevents the horizontal misregistration of the semiconductor wafer W supported by the substrate support pins 77.

As illustrated in FIGS. 2 and 3, an opening 78 is formed in the holding plate 75 of the susceptor 74 so as to extend vertically through the holding plate 75 of the susceptor 74. The opening 78 is provided for the back surface side radiation thermometer 20 to receive radiation (infrared radiation) emitted from the lower surface of the semiconductor wafer W. That is to say, the back surface side radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer the semiconductor wafer W. The plurality of back surface side radiation thermometers 20 may be provided to measure an in-plane temperature distribution of the semiconductor wafer W. When the plurality of back surface side radiation thermometers 20 are provided, the plurality of openings 78 also need to be provided.

Figure 5:
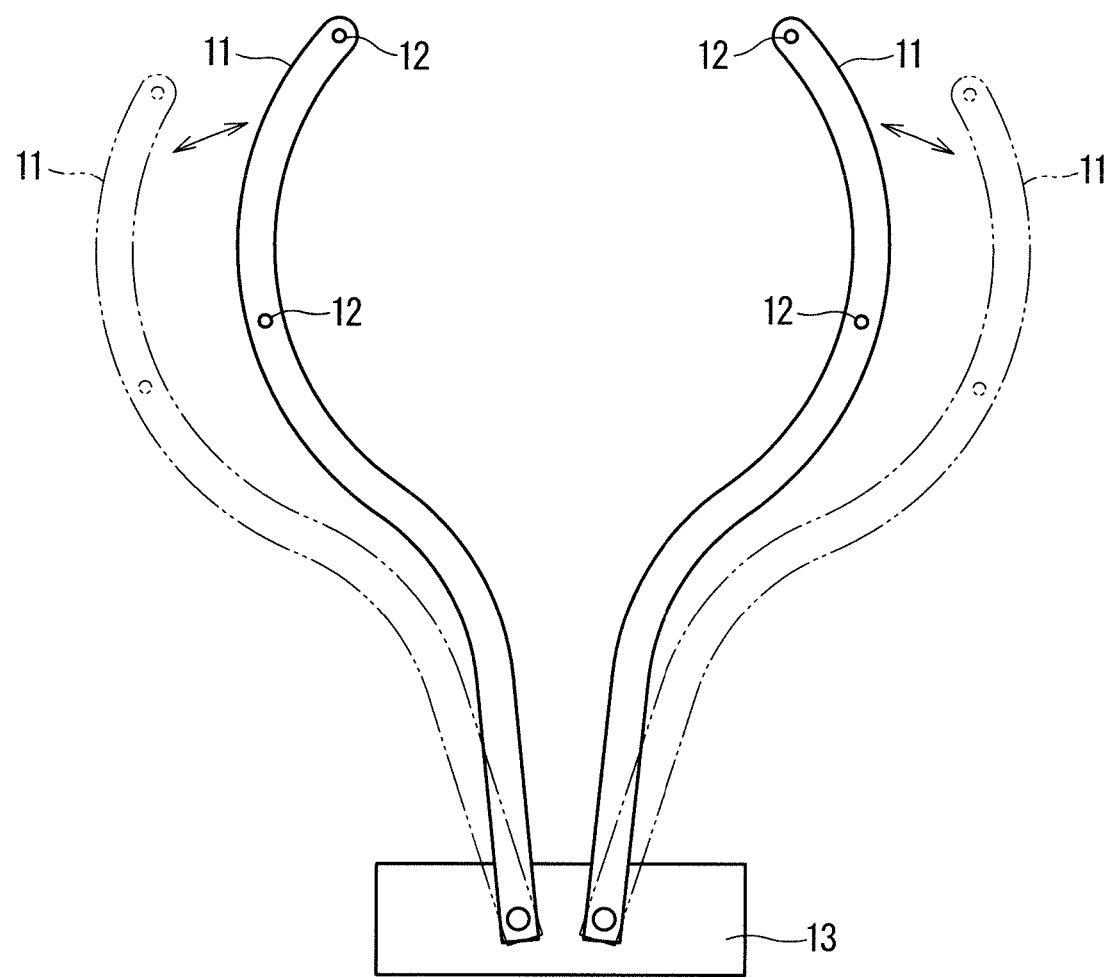
FIG. 5 is a plan view of a transfer mechanism.
Figure 6:
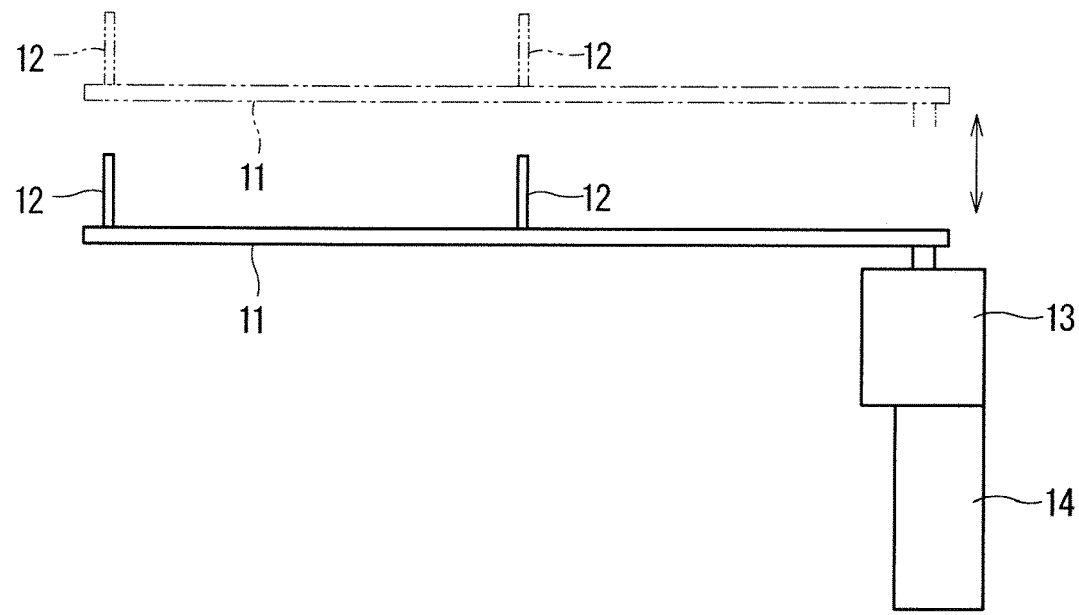
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in a plan view. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
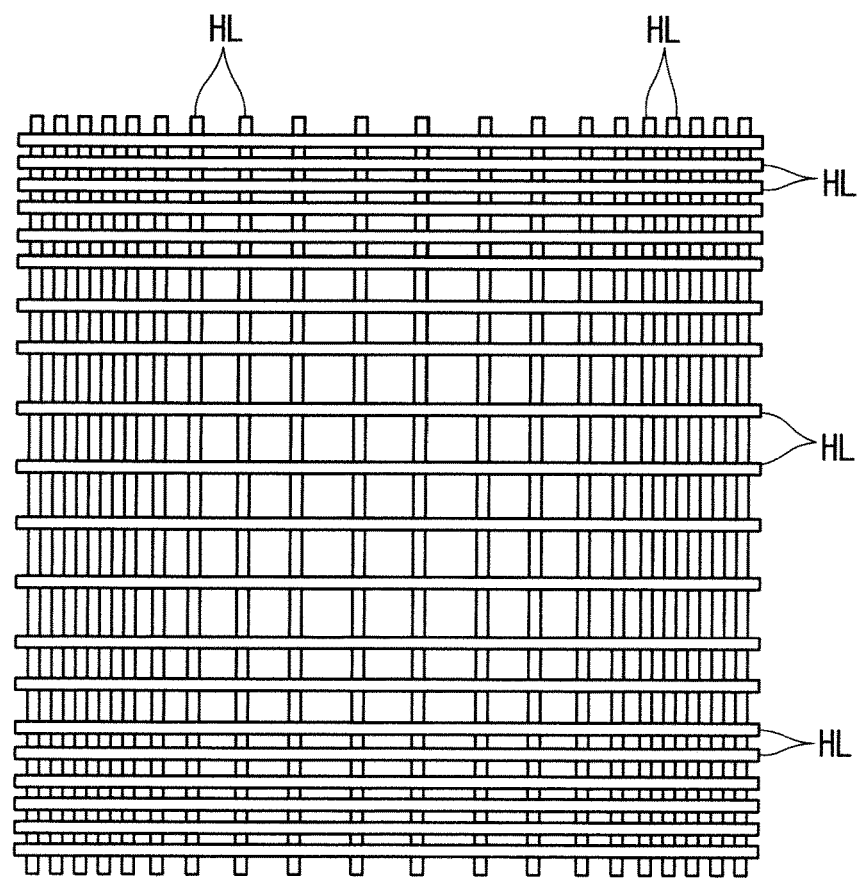
FIG. 7 is a plan view showing an arrangement of a plurality of halogen lamps.

FIG. 7 is a plan view showing an arrangement of the multiple halogen lamps HL. The 40 halogen lamps HL are arranged in two tiers, i.e. upper and lower tiers. 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holder 7 (that is, in the horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral part of the semiconductor wafer W held by the holder 7 than in a region opposed to a central part thereof. In other words, the halogen lamps HL in each of the upper and lower tiers are arranged at shorter intervals in the peripheral part of the lamp arrangement than in the central part thereof. This allows a greater amount of light to impinge upon the peripheral part of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. Gas prepared by introducing a halogen element (iodine, bromine and the like) in trace amounts into inactive gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
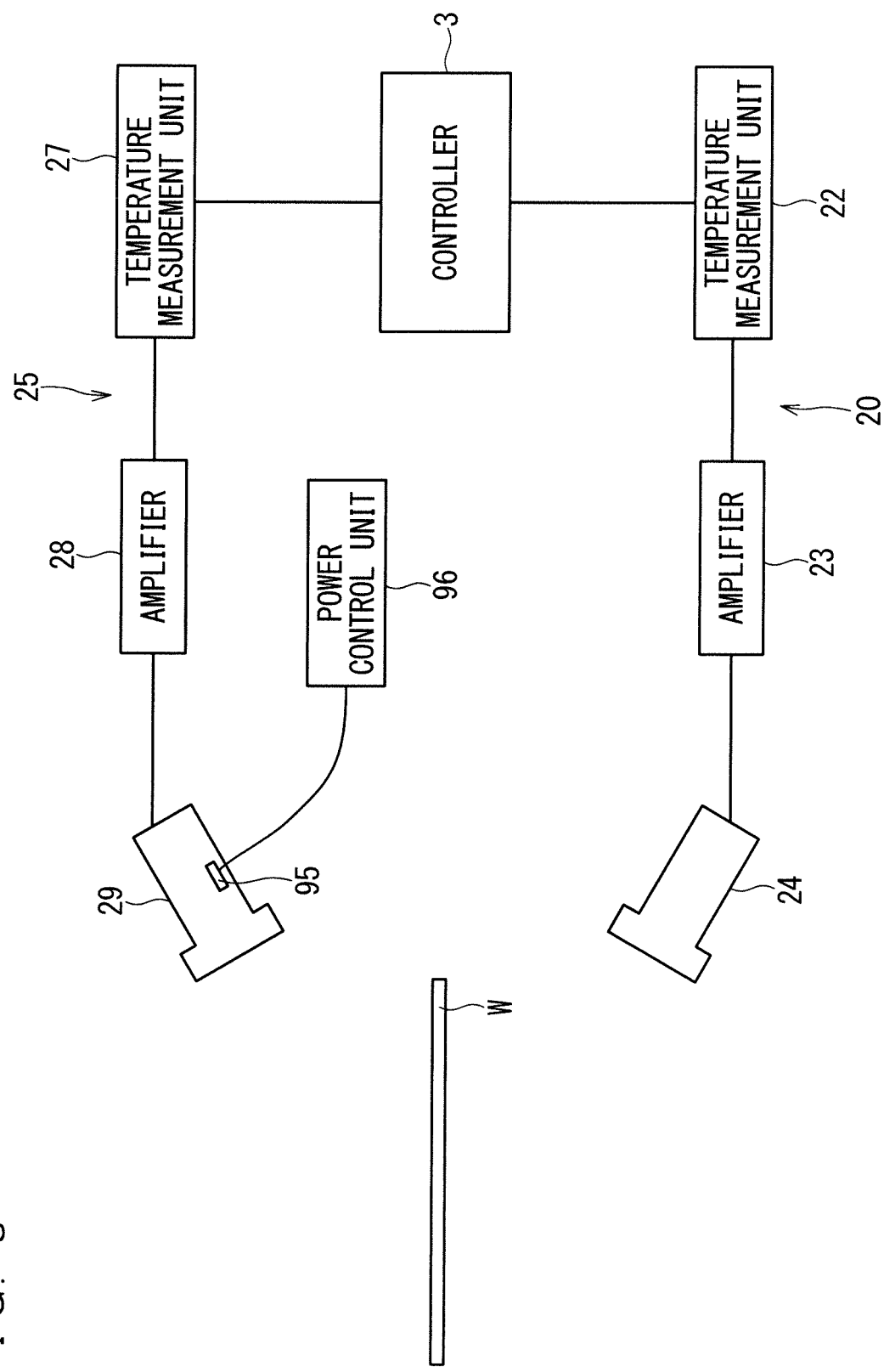
FIG. 8 is a functional block diagram of a front surface side radiation thermometer and a back surface side radiation thermometer.

As illustrated in FIG. 1, the chamber 6 is provided with two radiation thermometers of the front surface side radiation thermometer 25 and the back surface side radiation thermometer 20. FIG. 8 is a functional block diagram of the front surface side radiation thermometer 25 and the back surface side radiation thermometer 20. The front surface side radiation thermometer 25 is disposed obliquely above the semiconductor wafer W held by the susceptor 74 to measure the temperature of the upper surface of the semiconductor wafer W. The front surface side radiation thermometer 25 includes the infrared radiation sensor 29, an amplifier 28, and a temperature measurement unit 27. The infrared radiation sensor 29 receives infrared radiation emitted from the upper surface of the semiconductor wafer W held by the susceptor 74. The infrared radiation sensor 29 includes an optical element of Indium antimony (InSb) to cope with a rapid temperature change in the upper surface of the semiconductor wafer W at the moment of the flash irradiation. The infrared radiation sensor 29 transmits a signal generated in response to light reception to the amplifier 28. The signal being output from the infrared radiation sensor 29 is amplified by the amplifier 28 and then input to the temperature measurement unit 27. The temperature measurement unit 27 includes an A/D convertor and a temperature conversion circuit not shown in the drawings, for example, and converts a signal indicating strength of infrared radiation being output from the infrared radiation sensor 29 into a temperature. The temperature obtained by the temperature measurement unit 27 is a temperature of the upper surface of the semiconductor wafer W.

In the meanwhile, the back surface side radiation thermometer 20 is disposed obliquely below the semiconductor wafer W held by the susceptor 74 to measure the temperature of the lower surface of the semiconductor wafer W. The back surface side radiation thermometer 20 includes the infrared radiation sensor 24, an amplifier 23, and a temperature measurement unit 22. The infrared radiation sensor 24 receives infrared radiation emitted via the opening 78 from the lower surface of the semiconductor wafer W held by the susceptor 74. The infrared radiation sensor 24 transmits a signal generated in response to light reception to the amplifier 23. The signal being output from the infrared radiation sensor 24 is amplified by the amplifier 23 and then input to the temperature measurement unit 22. The temperature measurement unit 22 includes an A/D convertor and a temperature conversion circuit not shown in the drawings, for example, and converts a signal indicating strength of infrared radiation being output from the infrared radiation sensor 24 into a temperature. The temperature obtained by the temperature measurement unit 22 is a temperature of the lower surface of the semiconductor wafer W.

The infrared radiation sensor 29 of the front surface side radiation thermometer 25 is additionally provided with a cooling element 95. A Peltier element, for example, is used as the cooling element 95. The cooling element 95 is electrically connected to a power control unit 96. The power control unit 96 controls power supplied to the cooling element 95, thus the cooling element 95 cools a light receiving element of the infrared radiation sensor 29 to 0° C. or less. In the present embodiment, the light receiving element of the infrared radiation sensor 29 is cooled to −25° C., for example. When a temperature of the light receiving element of InSb included in the infrared radiation sensor 29 increases, detection sensitivity decreases, however, when the light receiving element is cooled to 0° C. or less by the cooling element 95, the infrared radiation sensor 29 can maintain high sensitivity.

The back surface side radiation thermometer 20 and the front surface side radiation thermometer 25 are electrically connected to the controller 3 as a controller of the whole heat treatment apparatus 1, and the temperatures of the lower surface and the upper surface of the semiconductor wafer W measured with the back surface side radiation thermometer 20 and the front surface side radiation thermometer 25, respectively, are transmitted to the controller 3. The controller 3 controls various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined treatment program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of the semiconductor wafer W. As an example, a water cooling tube (not shown) is provided in the walls of the chamber 6. Cooling water is supplied from outside of the heat treatment apparatus 1 to the water cooling tube, thereby cooling a wall surface of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

A treatment operation in the heat treatment apparatus 1 is described next. A heat treatment operation performed on a normal semiconductor wafer (product wafer) W which becomes a product is described herein first. The process procedure in the semiconductor wafer W described hereinafter proceeds when the controller 3 controls each operation mechanism of the heat treatment apparatus 1.

Firstly, the valve 84 for gas supply is opened and the valve 89 for gas exhaust are opened to start gas supply and exhaust within the chamber 6 prior to the treatment of the semiconductor wafer W. When the valve 84 is opened, nitrogen gas is supplied from the gas supply opening 81 into the heat treatment space 65. Also, when the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. The nitrogen gas is continuously supplied into the heat treatment space 65 at the time of the heat treatment of the semiconductor wafer W in the heat treatment apparatus 1, and an amount of supply is appropriately changed in accordance with a treatment process.

Subsequently, the gate valve 185 is opened to open the transport opening 66. A transport robot outside the heat treatment apparatus 1 transports the semiconductor wafer W to be processed through the transport opening 66 into the heat treatment space 65 in the chamber 6. At this time, there is a possibility that the atmosphere outside the apparatus is carried into the heat treatment space 65 as the semiconductor wafer W is transported into the heat treatment space 65, however, the nitrogen gas is continuously supplied into chamber 6, thus the nitrogen gas flows through the transport opening 66 and it is possible to minimize an outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that a front surface as a processed surface is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in the horizontal attitude from below by the susceptor 74 of the holder 7 formed of quartz, the 40 halogen lamps HL in the halogen heating part 4 are turned on at the same time and preheating (or assist-heating) is started. Halogen light emitted from the halogen lamps HL is transmitted through the lower chamber window 64 and the susceptor 74 both made of quartz, and impinges on the lower surface of the semiconductor wafer W. By receiving irradiation with light from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured with the back surface side radiation thermometer 20. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the back surface side radiation thermometer 20.

After the temperature of the semiconductor wafer W reaches the preheating temperature T1, the controller 3 maintains the temperature of the semiconductor wafer W at the preheating temperature T1 for a short time. Specifically, at a time when the temperature of the semiconductor wafer W measured with the back surface side radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at a time when a predetermined time period has elapsed since the temperature of the semiconductor wafer W reaches the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such a flash of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W flash-heated by the flash irradiation from the flash lamps FL is increased instantaneously to a treatment temperature T2 of 1000° C. or more, and then the temperature of the front surface decreases rapidly.

When the flash heating treatment is finished, the halogen lamps HL are turned off after an elapse of a predetermined time. Accordingly, the temperature of the semiconductor wafer W decreases rapidly from the preheating temperature T1. The back surface side radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the back surface side radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6. Thus, the heating treatment of the semiconductor wafer W is completed.

The front surface side radiation thermometer 25 measures the temperature of the front surface of the semiconductor wafer W increased instantaneously at the time of the flash heating. However, a pattern is generally formed on the front surface of the semiconductor wafer W which becomes a product in many cases. Emissivity of the front surface of the semiconductor wafer W is also different depending on the pattern formed on the front surface. Thus, when emissivity of the surface is not obtained for each semiconductor wafer W subject to the heat treatment in the heat treatment apparatus 1 and set to the front surface side radiation thermometer 25, the temperature of the front surface of the semiconductor wafer W cannot be accurately measured. In the present embodiment, the temperature of the front surface of the semiconductor wafer W is accurately measured as described hereinafter.

Figure 9:
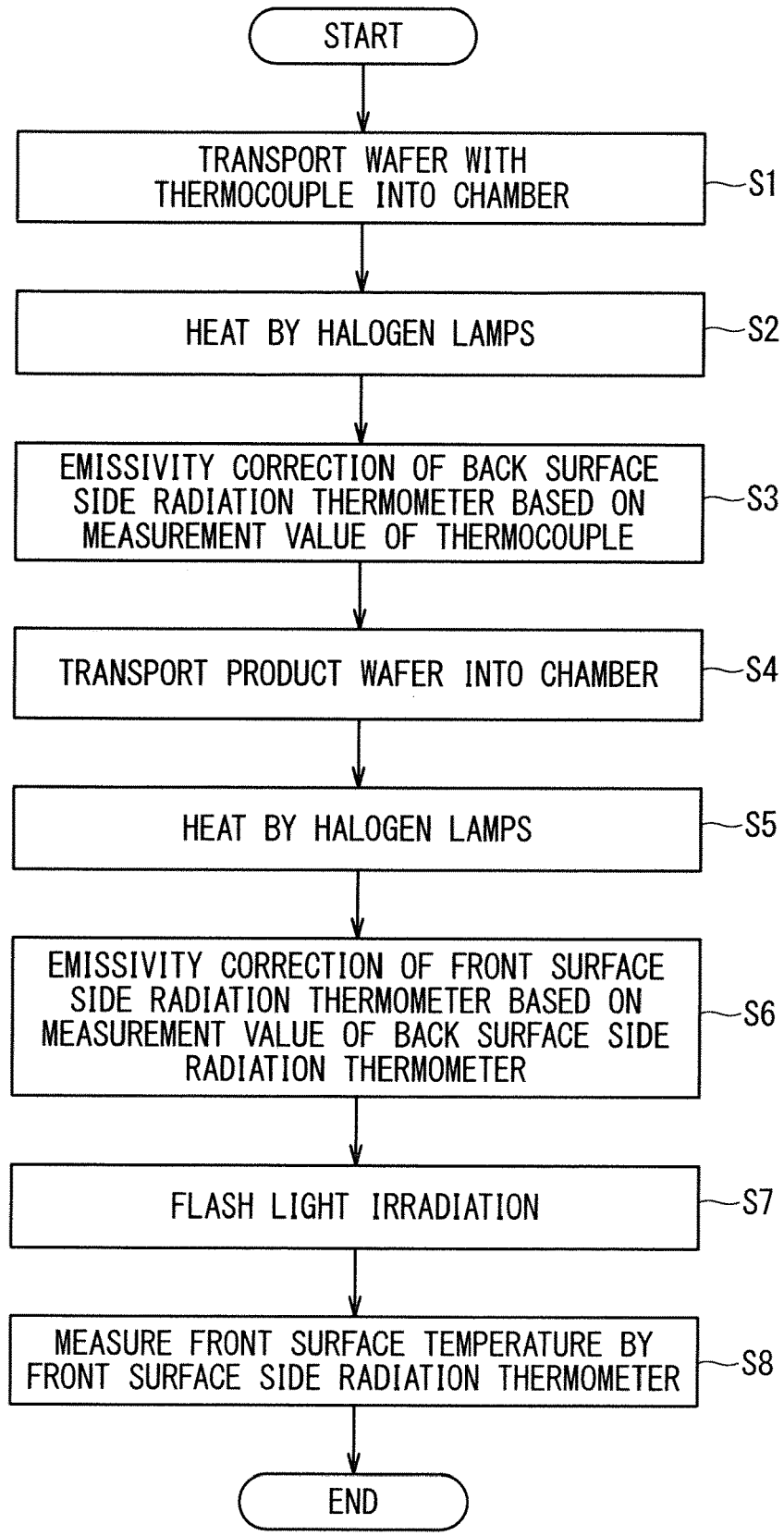
FIG. 9 is a flow chart showing a procedure for a heat measurement method according to the present invention.

FIG. 9 is a flow chart showing a procedure for a heat measurement method according to the present invention. Firstly, a wafer with thermocouple TW (first substrate) is transported into the chamber 6 prior to the treatment of the semiconductor wafer W which becomes a product (Step S1). The wafer with thermocouple TW is a disk-shaped silicon wafer similar to the semiconductor wafer W which becomes a product, and has a size and a shape similar to the semiconductor wafer W. A pattern formation or a lamination is not performed on the wafer with thermocouple TW. A thermocouple is attached to a front surface of the wafer with thermocouple TW. The thermocouple is made up of a metal wire, thus the wafer with thermocouple TW cannot be transported into the chamber 6 using a transport robot. Thus, the wafer with thermocouple TW is manually transported into the chamber 6 and placed on the susceptor 74.

After the wafer with thermocouple TW is placed on the quartz susceptor 74, the irradiation with light from the halogen lamps HL is started and the wafer with thermocouple TW is heated (Step S2). The heating of the wafer with thermocouple TW by irradiation with light from the halogen lamps HL is substantially similar to the preheating of the semiconductor wafer W described above. That is to say, the radiation emitted from the halogen lamps HL is transmitted through the lower chamber window 64 and the susceptor 74 both made of quartz, and impinges on a back surface of the wafer with thermocouple TW, and a temperature of the wafer with thermocouple TW increases. The temperature of the wafer with thermocouple TW which is on the increase by the irradiation with light from the halogen lamps HL is measured with the back surface side radiation thermometer 20. The controller 3 effects feedback control of the output from the halogen lamps HL so that the temperature of the wafer with thermocouple TW is equal to a predetermined temperature, based on a temperature value measured with the back surface side radiation thermometer 20. After the temperature of the wafer with thermocouple TW reaches the predetermined temperature, the wafer with thermocouple TW is maintained at a predetermined temperature for a certain period of time by irradiation with light from the halogen lamps HL.

Figure 10:
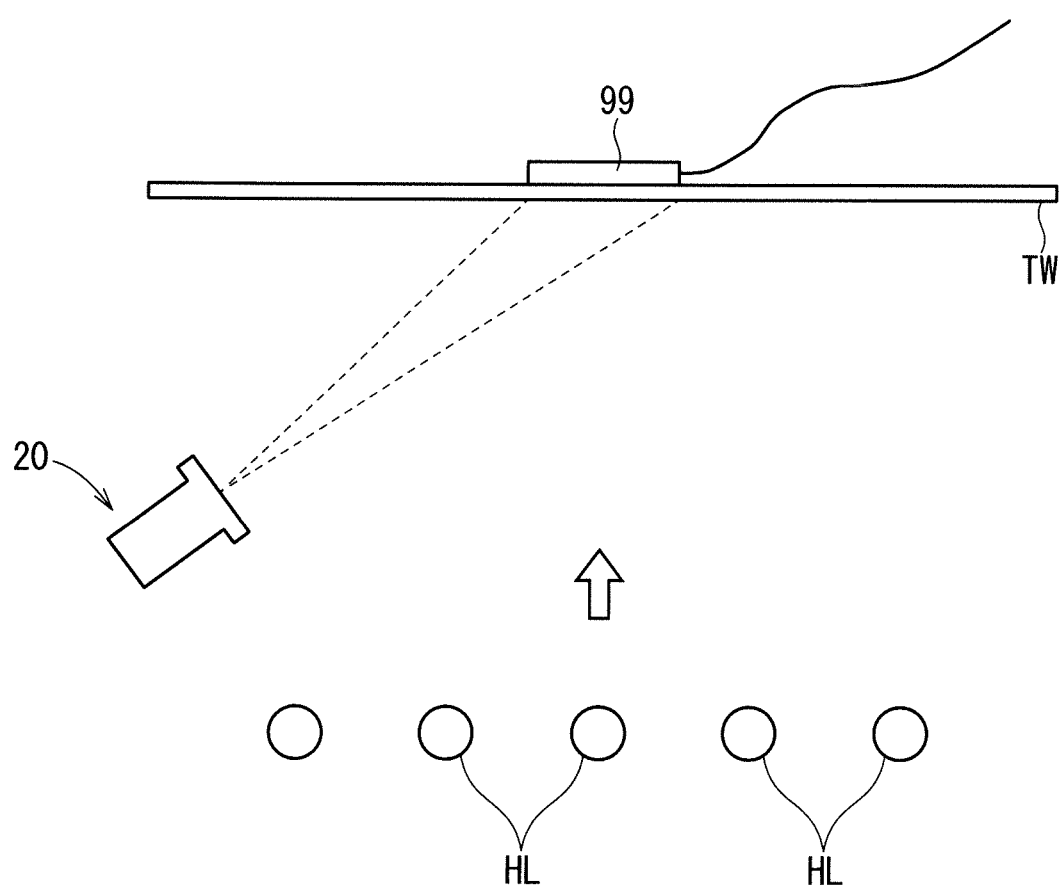
FIG. 10 is a diagram schematically describing an emissivity correction of the back surface side radiation thermometer based on a measurement value of a thermocouple.

While the wafer with thermocouple TW is maintained at the predetermined temperature, an emissivity correction of the back surface side radiation thermometer 20 is performed based on a measurement value of the thermocouple (Step S3). FIG. 10 is a diagram schematically describing an emissivity correction of the back surface side radiation thermometer 20 based on a measurement value of a thermocouple 99. The wafer with thermocouple TW is maintained at a predetermined temperature for a certain period of time by irradiation with light from the halogen lamps HL. The thermocouple 99 is attached to the front surface of the wafer with thermocouple TW. The thermocouple 99 measures the temperature of the front surface of the wafer with thermocouple TW heated to a predetermined temperature by irradiation with light from the halogen lamps HL.

In the meanwhile, the temperature of the back surface of the wafer with thermocouple TW heated to a predetermined temperature by the irradiation with light from the halogen lamps HL is measured with the back surface side radiation thermometer 20. A position in the front surface of the wafer with thermocouple TW where the thermocouple 99 is attached and a position in the back surface of the wafer with thermocouple TW where the temperature is measured with the back surface side radiation thermometer 20 are symmetric with respect to the wafer with thermocouple TW. When the wafer with thermocouple TW is maintained at a predetermined temperature, there is no difference in temperature between the front surface and the back surface of the wafer with thermocouple TW, and the front surface temperature and the back surface temperature are equal to each other. Thus, the temperature of the position in the front surface of the wafer with thermocouple TW where the thermocouple 99 is attached and the temperature of the position in the back surface of the wafer with thermocouple TW where the temperature is measured with the back surface side radiation thermometer 20 are completely equal to each other.

The thermocouple 99 which is a contact-type thermometer can accurately measure the temperature of the front surface of the wafer with thermocouple TW. Accordingly, emissivity set to the back surface side radiation thermometer 20 can be corrected based on the temperature of the wafer with thermocouple TW measured with the thermocouple 99. Specifically, emissivity set to the back surface side radiation thermometer 20 is adjusted so that the front surface temperature of the wafer with thermocouple TW measured with the thermocouple 99 and the back surface temperature of the wafer with thermocouple TW indicated by the back surface side radiation thermometer 20 coincide with each other. Accordingly, true emissivity of the back surface of the wafer with thermocouple TW is set to the back surface side radiation thermometer 20, and emissivity set to the back surface side radiation thermometer 20 can be accurately corrected.

After the emissivity correction of the back surface side radiation thermometer 20 is finished, the wafer with thermocouple TW is transported out of the chamber 6. The wafer with thermocouple TW is also transported out of the chamber 6 manually. It is sufficient that the emissivity correction of the back surface side radiation thermometer 20 using the wafer with thermocouple TW described above is performed at a time of maintenance of the heat treatment apparatus 1, for example.

Next, a heat treatment is performed on the semiconductor wafer (second substrate) W which becomes a product. A pattern is typically formed on the front surface of the semiconductor wafer W which becomes a product. The heat treatment operation performed on the semiconductor wafer W which becomes a product is as described above. Firstly, the semiconductor wafer W which becomes a product is transported into the chamber 6 (Step S4). The semiconductor wafer W is transported into the chamber 6 and placed on the susceptor 74 by the transport robot.

Figure 11:
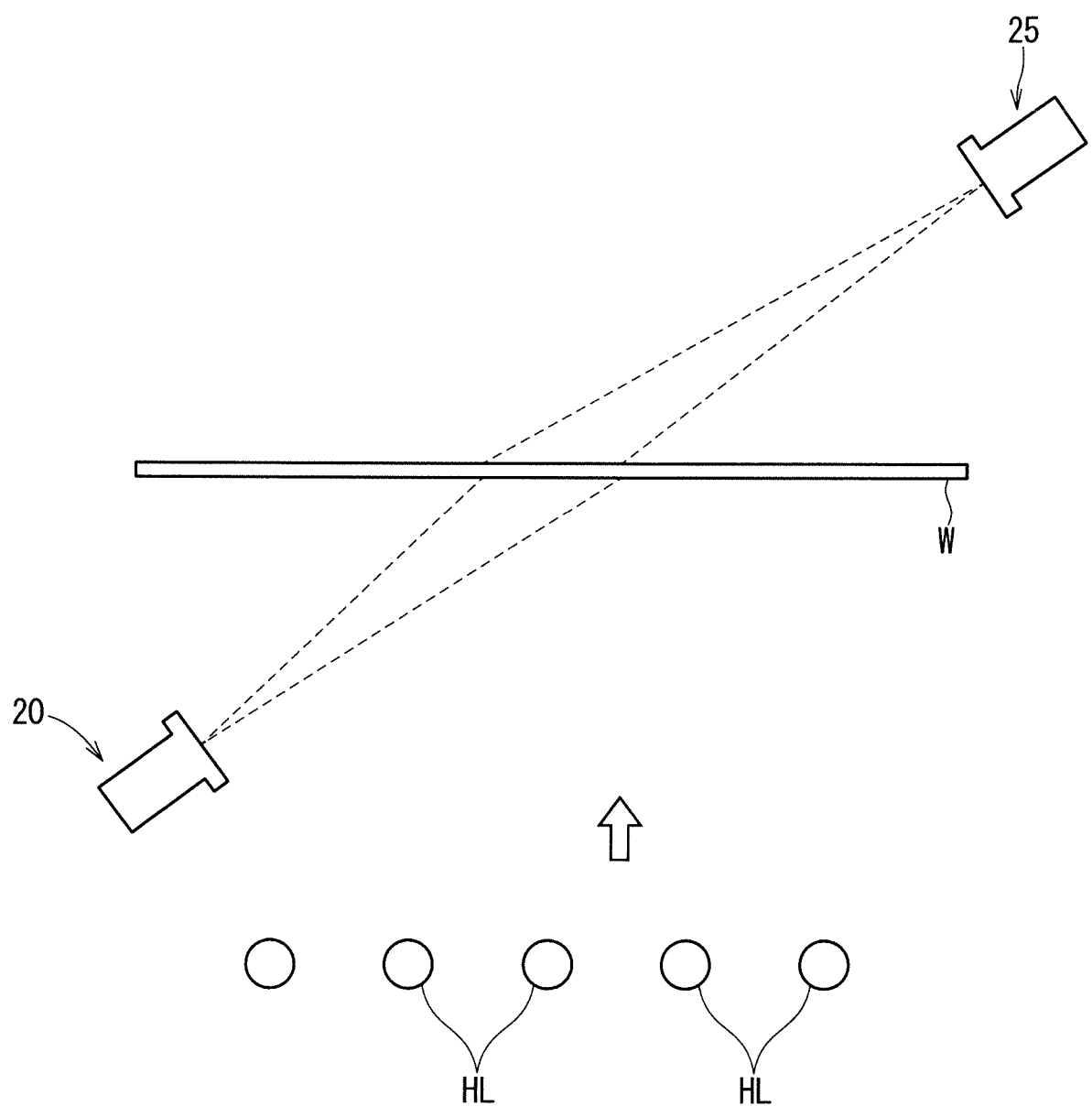
FIG. 11 is a diagram schematically describing an emissivity correction of the back surface side radiation thermometer based on a measurement value of a thermocouple.

After the semiconductor wafer W is placed on the quartz susceptor 74, the irradiation with light from the halogen lamps HL is started and the semiconductor wafer W is preheated (Step S5). As described above, the temperature of the semiconductor wafer W which is on the increase by the irradiation with light from the halogen lamps HL is measured with the back surface side radiation thermometer 20. The controller 3 effects feedback control of the output from the halogen lamps HL so that the temperature of the semiconductor wafer W is equal to a predetermined preheating temperature T1, based on a temperature value measured with the back surface side radiation thermometer 20. After the temperature of the semiconductor wafer W reaches the preheating temperature T1, the semiconductor wafer W is maintained at the preheating temperature T1 for a certain period of time by irradiation with light from the halogen lamps HL. While the semiconductor wafer W is maintained at the preheating temperature T1, the emissivity correction of the front surface side radiation thermometer 25 is performed based on a measurement value of the back surface side radiation thermometer 20 (Step S6). FIG. 11 is a diagram schematically describing an emissivity correction of the front surface side radiation thermometer 25 based on a measurement value of the back surface side radiation thermometer 20. The semiconductor wafer W is maintained at the preheating temperature T1 for a certain period of time by irradiation with light from the halogen lamps HL. The temperature of the back surface of the semiconductor wafer W heated to the preheating temperature T1 by the irradiation with light from the halogen lamps HL is measured with the back surface side radiation thermometer 20. Even in the semiconductor wafer W which becomes a product, a pattern is not formed on the back surface thereof in the manner similar to the wafer with thermocouple TW. Thus, the emissivity of the back surface of the wafer with thermocouple TW and the emissivity of the back surface of the semiconductor wafer W are equal to each other. In Step S3, the emissivity of the back surface of the wafer with thermocouple TW is set to the back surface side radiation thermometer 20, and the emissivity correction of the back surface side radiation thermometer 20 is completed. Accordingly, the back surface side radiation thermometer 20 can accurately measure the temperature of the back surface of the semiconductor wafer W having the same emissivity as the back surface of the wafer with thermocouple TW.

In the meanwhile, the temperature of the front surface of the semiconductor wafer W heated to the preheating temperature T1 by the irradiation with light from the halogen lamps HL is measured with the front surface side radiation thermometer 25. A position in the front surface of the semiconductor wafer W where the temperature is measured with the front surface side radiation thermometer 25 and a position in the back surface of the semiconductor wafer W where the temperature is measured with the back surface side radiation thermometer 20 are symmetric with respect to the semiconductor wafer W. When the semiconductor wafer W is maintained at the preheating temperature T1, there is no difference in temperature between the front surface and the back surface of the semiconductor wafer W, and the front surface temperature and the back surface temperature are equal to each other. Thus, the temperature in the position in the front surface of the semiconductor wafer W where the temperature is measured with the front surface side radiation thermometer 25 and the temperature in the position in the back surface of the semiconductor wafer W where the temperature is measured with the back surface side radiation thermometer 20 are completely equal to each other.

As described above, the back surface side radiation thermometer 20 accurately measures the back surface temperature of the semiconductor wafer W. Accordingly, emissivity set to the front surface side radiation thermometer 25 can be corrected based on the temperature of the semiconductor wafer W measured with the back surface side radiation thermometer 20. Specifically, emissivity set to the front surface side radiation thermometer 25 is adjusted so that the back surface temperature of the semiconductor wafer W indicated by the back surface side radiation thermometer 20 and the front surface temperature of the semiconductor wafer W indicated by the front surface side radiation thermometer 25 coincide with each other. Accordingly, the emissivity of the front surface of the semiconductor wafer W to be processed is set to the front surface side radiation thermometer 25, and the emissivity set to the front surface side radiation thermometer 25 can be accurately corrected.

After the emissivity correction of the front surface side radiation thermometer 25 is finished, the front surface of the semiconductor wafer W is irradiated with a flash of light from the flash lamps FL (Step S7). The front surface of the semiconductor wafer W is irradiated with the flash of light for 0.1 to about 100 milliseconds, thus the temperature thereof is increased instantaneously and then decreases rapidly.

The front surface temperature of the semiconductor wafer W heated by the flash light irradiation is measured with the front surface side radiation thermometer 25 on which the emissivity correction is already performed (Step S8). The front surface side radiation thermometer 25 includes the light receiving element of InSb, thus can appropriately measure the front surface temperature of the semiconductor wafer W rapidly changing by the flash light irradiation in a short sampling cycle. The emissivity of the front surface of the semiconductor wafer W on which the pattern is formed is set to the front surface side radiation thermometer 25 before the flash light irradiation, and the emissivity correction of the front surface side radiation thermometer 25 is completed. Accordingly, the front surface side radiation thermometer 25 can accurately measure the temperature of the front surface of the semiconductor wafer W heated by the flash light irradiation.

In the present embodiment, while the wafer with thermocouple TW having the front surface to which the thermocouple 99 is attached is heated by irradiation with light from the halogen lamps HL, the front surface temperature of the wafer with thermocouple TW is measured with the thermocouple 99 and the back surface temperature thereof is measured with the back surface side radiation thermometer 20. The emissivity set to the back surface side radiation thermometer 20 is corrected based on the temperature of the wafer with thermocouple TW measured with the thermocouple 99.

Next, after the emissivity correction of the back surface side radiation thermometer 20 is finished, while the semiconductor wafer W with the pattern on the front surface is heated by irradiation with light from the halogen lamps HL, the temperature of the back surface and the temperature of the front surface of the semiconductor wafer W are measured with the back surface side radiation thermometer 20 and the front surface side radiation thermometer 25, respectively. Then, the emissivity set to the front surface side radiation thermometer 25 is corrected based on the temperature of the semiconductor wafer W measured with the back surface side radiation thermometer 20.

In short, the emissivity set to the back surface side radiation thermometer 20 and the front surface side radiation thermometer 25 is corrected in two stages based on the accurate temperature measurement value obtained by the thermocouple 99 which is the contact-type thermometer. Thus, even if the emissivity of both the front and back surfaces of the semiconductor wafer W is unknown, the emissivity set to the back surface side radiation thermometer 20 and the front surface side radiation thermometer 25 can be appropriately corrected, and the front surface temperature of the semiconductor wafer W can be accurately measured by the front surface side radiation thermometer 25. There is no process that an object has contact with the front surface of the semiconductor wafer W which becomes a product, thus the temperature of the front surface can be accurately measured without damaging the pattern formed on the front surface of the semiconductor wafer W.

When the emissivity of the back surface side radiation thermometer 20 is corrected, the thermocouple 99 and the back surface side radiation thermometer 20 measure the temperature of the wafer with thermocouple TW while the wafer with thermocouple TW is maintained at a predetermined temperature by the irradiation with light from the halogen lamps HL. Accordingly, there is no difference in temperature between the front surface and the back surface of the wafer with thermocouple TW, and the emissivity set to the back surface side radiation thermometer 20 can be accurately corrected based on the temperature measurement value of the thermocouple 99.

In the similar manner, when the emissivity of the front surface side radiation thermometer 25 is corrected, the back surface side radiation thermometer 20 and the front surface side radiation thermometer 25 measure the temperature of the semiconductor wafer W while the semiconductor wafer W is maintained at a predetermined temperature by irradiation with light from the halogen lamps HL. Accordingly, there is no difference in temperature between the front surface and the back surface of the semiconductor wafer W, and the emissivity set to the front surface side radiation thermometer 25 can be accurately corrected based on the temperature measurement value of the back surface side radiation thermometer 20.

The position in the front surface of the wafer with thermocouple TW where the thermocouple 99 is attached and the position in the back surface of the wafer with thermocouple TW where the temperature is measured with the back surface side radiation thermometer 20 are symmetric with respect to the wafer with thermocouple TW. Accordingly, there is no difference in temperature between them, and the emissivity set to the back surface side radiation thermometer 20 can be more accurately corrected based on the temperature measurement value of the thermocouple 99.

In the same manner, the position in the front surface of the semiconductor wafer W where the temperature is measured with the front surface side radiation thermometer 25 and the position in the back surface of the semiconductor wafer W where the temperature is measured with the back surface side radiation thermometer 20 are symmetric with respect to the semiconductor wafer W. Accordingly, there is no difference in temperature between them, and the emissivity set to the front surface side radiation thermometer 25 can be more accurately corrected based on the temperature measurement value of the back surface side radiation thermometer 20.

The cooling element 95 cools the light receiving element of the front surface side radiation thermometer 25 to 0° C. or less when the front surface side radiation thermometer 25 measures the front surface temperature of the semiconductor wafer W. Accordingly, the infrared radiation sensor 29 of the front surface side radiation thermometer 25 can maintain the high sensitivity, and the front surface side radiation thermometer 25 can accurately measure the temperature of the front surface of the semiconductor wafer W heated by the flash light irradiation.

Furthermore, in the present embodiment, the water cooling tube is provided in the walls of the chamber 6, and the cooling water is supplied to the water cooling tube, thereby cooling the wall surface of the chamber 6. Accordingly, an influence of infrared radiation (stray light) emitting from the wall surface of the chamber 6 and entering the back surface side radiation thermometer 20 and the front surface side radiation thermometer 25 can be suppressed, and reduction in accuracy of the temperature measurement can be prevented.

While the preferred embodiments according to the present invention have been described hereinabove, various modifications of the present invention are possible in addition to those described above without departing from the scope and spirit of the present invention. For example, in the embodiment described above, the front surface temperature of the wafer with thermocouple TW is measured with the thermocouple 99. However, the configuration is not limited thereto, but the front surface temperature thereof may be measured with the other contact-type thermometer, that is a thermistor or a resistance temperature detector, for example. That is to say, any configuration is applicable as long as the front surface temperature of the wafer with thermocouple TW is accurately measured with a contact-type thermometer.

Stray light entering the back surface side radiation thermometer 20 and the front surface side radiation thermometer 25 may be suppressed by providing a polarized filter in addition to the cooling of the wall surface of the chamber 6. Accordingly, reduction in accuracy of the temperature measurement can be prevented more effectively.

A thermometer having an appropriate measurement wavelength range is preferably used as the back surface side radiation thermometer 20 in accordance with an atmosphere formed in the chamber 6. For example, when ammonia atmosphere is formed in the chamber 6, the back surface side radiation thermometer 20 having a measurement wavelength range different from an absorption wavelength range of ammonia is preferably used. Alternatively, a filter transmitting or blocking light in an appropriate wavelength range in accordance with an object to be measured may be disposed.

In the embodiment described above, the infrared radiation sensor 29 included in the front surface side radiation thermometer 25 includes the optical element of Indium antimony (InSb) to cope with the rapid temperature change in the upper surface of the semiconductor wafer W at the moment of the flash irradiation. However, the configuration is not limited thereto, but an optical sensor can be used as the infrared radiation sensor 29. For example, the infrared radiation sensor 29 may be a sensor having low responsiveness such as a thermopile to measure an in-plane temperature distribution of the semiconductor wafer W at the time of heating by irradiation with light from the halogen heating part 4. The plurality of front surface side radiation thermometers 25 may be provided. Accordingly, there is no need to provide the plurality of back surface side radiation thermometers 20 for measuring an in-plane temperature distribution of the semiconductor wafer W and the opening 78 for receiving radiation (infrared radiation) emitted from the lower surface of the semiconductor wafer W. Thus, it is possible to prevent reduction in uniformity of the in-plane temperature of the semiconductor wafer W at the time of heating caused by reduction in uniformity of irradiation with light from the halogen heating part 4 occurring by providing the plurality of openings 78.

Although the 30 flash lamps FL are provided in the flash heating part 5 according to the aforementioned embodiment, the present invention is not limited thereto. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Performed in the embodiment described above is the heat treatment of maintaining the substrate at the predetermined temperature using the filament-type halogen lamps HL as the continuous lighting lamps that emit light continuously for at least not less than one second. The present invention, however, is not limited to this. In place of the halogen lamps HL, discharge type arc lamps (e.g., xenon arc lamps) or LED lamps may be used as continuous lighting lamps to perform the heat treatment.

While the invention has been shown and described in detail, the foregoing description is in all aspects illustrative and not restrictive. It is therefore understood that numerous modifications and variations can be devised without departing from the scope of the invention.

What is claimed is:

1. A temperature measurement method of measuring a temperature of a substrate, comprising steps of:
    (a) measuring a temperature of a back surface of a first substrate with a back surface side radiation thermometer while heating the first substrate having a front surface to which a contact-type thermometer is attached, and correcting emissivity set to the back surface side radiation thermometer based on a temperature of the first substrate measured with the contact-type thermometer;
    (b) measuring a temperature of a back surface and a temperature of a front surface of a second substrate having a pattern formed on the front surface with the back surface side radiation thermometer and a front surface side radiation thermometer, respectively, while heating the second substrate, and correcting emissivity set to the front surface side radiation thermometer based on a temperature of the second substrate measured with the back surface side radiation thermometer; and
    (c) measuring a temperature of the front surface of the second substrate heated by irradiation with light with the front surface side radiation thermometer.

2. The temperature measurement method according to claim 1, wherein
    in the step (a) and the step (b), the first substrate and the second substrate are heated by irradiation with light from continuous lighting lamps.

3. The temperature measurement method according to claim 1, wherein
    in the step (c), the temperature of the front surface of the second substrate increasing when the front surface of the second substrate is irradiated with flash of light from flash lamps is measured with the front surface side radiation thermometer.

4. The temperature measurement method according to claim 1, wherein
    a position where the contact-type thermometer is attached and a position where the back surface side radiation thermometer measures a temperature are symmetric with respect to the first substrate, and
    a position where the back surface side radiation thermometer measures a temperature and a position where the front surface side radiation thermometer measures a temperature are symmetric with respect to the second substrate.

5. The temperature measurement method according to claim 1, wherein
    a light receiving element of the front surface side radiation thermometer is cooled to 0° C. or less when the temperature of the front surface of the second substrate is measured.

6. The temperature measurement method according to claim 1, wherein
    a wall surface of a chamber housing the first substrate and the second substrate is cooled.

7. The temperature measurement method according to claim 1, wherein
    the contact-type thermometer is a thermocouple.

8. The temperature measurement method according to claim 2, wherein
    in the step (a), the temperature of the first substrate is measured with the contact-type thermometer and the back surface side radiation thermometer when the first substrate is maintained at a predetermined temperature by irradiation with light from the continuous lighting lamps, and
    in the step (b), the temperature of the second substrate is measured with the back surface side radiation thermometer and the front surface side radiation thermometer when the second substrate is maintained at a predetermined temperature by irradiation with light from the continuous lighting lamps.

* * * * *